(12) United States Patent
Norman, Jr.

(10) Patent No.: US 7,355,192 B2
(45) Date of Patent: Apr. 8, 2008

(54) ADJUSTABLE SUSPENSION ASSEMBLY FOR A COLLIMATING LATTICE

(75) Inventor: Robert L. Norman, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/395,681

(22) Filed: Mar. 30, 2006

(65) Prior Publication Data

US 2007/0228302 A1    Oct. 4, 2007

(51) Int. Cl.
*H01J 5/18* (2006.01)
(52) U.S. Cl. .............................. 250/505.1; 250/503.1; 250/492.1; 250/492.2; 250/492.21; 250/492.22
(58) Field of Classification Search ........... 204/298.11, 204/192.12, 298.2, 298.06, 192.15; 250/503.1, 250/492.1–492.22, 363.1, 505.1
See application file for complete search history.

(56) References Cited

U.S. PATENT DOCUMENTS

| 3,005,282 | A | * | 10/1961 | Christiansen | ............... | 446/128 |
| 5,690,795 | A | * | 11/1997 | Rosenstein et al. | ...... | 204/192.1 |
| 5,985,102 | A | * | 11/1999 | Leiphart | ................ | 204/192.12 |
| 6,296,747 | B1 | * | 10/2001 | Tanaka | .................. | 204/298.07 |
| 6,398,929 | B1 | * | 6/2002 | Chiang et al. | ......... | 204/298.11 |
| 6,521,106 | B1 | * | 2/2003 | Actor et al. | ........... | 204/298.11 |
| 6,572,744 | B1 | * | 6/2003 | Paranjpe et al. | ....... | 204/298.11 |
| 6,780,294 | B1 | * | 8/2004 | Hixson et al. | ......... | 204/298.11 |
| 2003/0085121 | A1 | * | 5/2003 | Powell | .................. | 204/298.11 |

* cited by examiner

*Primary Examiner*—Jack I. Berman
*Assistant Examiner*—Michael J Logie
(74) *Attorney, Agent, or Firm*—Blakely, Sokoloff, Taylor & Zafman LLP

(57) ABSTRACT

According to one aspect of the invention a plasma-based substrate processing apparatus comprises a collimator holding device, which efficiently and accurately positions a collimator over a substrate to enable the plasma-based substrate processing apparatus to selectively deposit and/or remove material at the bottom of a high aspect ratio openings or trenches and/or protrusions. The collimator holding device may comprise a holder ring, with adjustable spacers, having the means of manually positioning a collimator a precise distance above and approximately parallel to the wafer support, while providing greater heat capacity and heat transfer rates, thus reducing the risk of thermal damage to the collimator. In an embodiment, the holder ring may further comprise one or more slots, which may provide ventilation for a mini-chamber above the substrate being processed. Embodiments disclose means for fast and easy removal and replacement of collimators and holder rings that enable customizing and changing collimators for different process applications, which may result in improved process flexibility, reliability, and performance.

28 Claims, 6 Drawing Sheets

ADJUSTABLE SUSPENSION ASSEMBLY FOR A COLLIMATING LATTICE

BACKGROUND OF THE INVENTION

1). Field of the Invention

Embodiments of the invention relate to a plasma-based substrate processing apparatus. Embodiments of the invention particularly relate to a collimator holding apparatus, which efficiently and accurately positions a collimator over a substrate to enable the plasma-based substrate processing apparatus to selectively deposit and/or remove material at the bottom of a high aspect ratio openings or trenches and/or protrusion.

2). Discussion of Related Art

Plasma-based substrate processing apparatus, such as a Physical Vapor Deposition (PVD) apparatus, may use a collimator, such as a honeycomb type, positioned over a substrate, to improve the directionality of the plasma impinging upon the substrate. Improved directionality may permit reduction of the voltage bias of the substrate, thus reducing potential detrimental effects on the structures formed on the substrate.

Plasma having directionality may be used to improve deposition of materials onto the bottom of high aspect ratio openings or trenches on the substrate being processed. Plasmas having directionality may increase material depositions on surfaces normal to the plasma direction, while reducing material depositions on surfaces parallel to the plasma direction. In cases of small dimension and high aspect ratio openings or trenches, sufficient plasma directionality is required to prevent excessive material depositions onto the sidewalls of openings or trenches, thus closing the openings or trenches at the top before the bottom has been completely filled. Insufficient plasma directionality may cause undesirable void formations in openings or trenches structures being processed. This may result in devices with degraded performance or even failed devices.

Collimators, in some cases, are precariously clipped and/or clamped onto the shielding in a PVD chamber, such as the deposition ring. This approach makes it difficult to adjust the height of the collimator precisely and reproducibly. Furthermore, it is very difficult to level the collimator parallel over the substrate. In addition, the collimator often may not be well grounded to the chamber, either electrically or thermally, which results in the collimator becoming electrically charged and/or excessively hot. These conditions may result in reduced directionality, damage to the collimator, and process variations with processing time.

In some cases, the installation or removal of a collimator in a PVD apparatus may involves a major redesign of the chamber and/or its parts, often requiring a considerable amount of labor, retooling, and expense. Neither the collimator, nor the height of the collimator over the substrate may easily be changed. Such changes may require significant additional retooling of the apparatus, resulting in reduced process flexibility and throughput, while also increasing costs.

Maintenance of the collimator, particularly in deposition processes, may require the periodic removal and reinstallation of the collimator for cleaning purposes. Collimators may need to be cleaned every 200-300 KW hours when performing 1 micron deposits. Difficulties in removing the collimator result in increased maintenance costs, reduced throughput, and decreased process uniformity.

BRIEF DESCRIPTION OF THE DRAWINGS

The invention is described by way of example with reference to the accompanying drawings, wherein.

DETAILED DESCRIPTION OF THE INVENTION

In the following description, various aspects of the present invention will be described, and various details set forth in order to provide a thorough understanding of the present invention. However, it would be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1 through 8 are merely illustrative and may not be drawn to scale. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Figure 1:
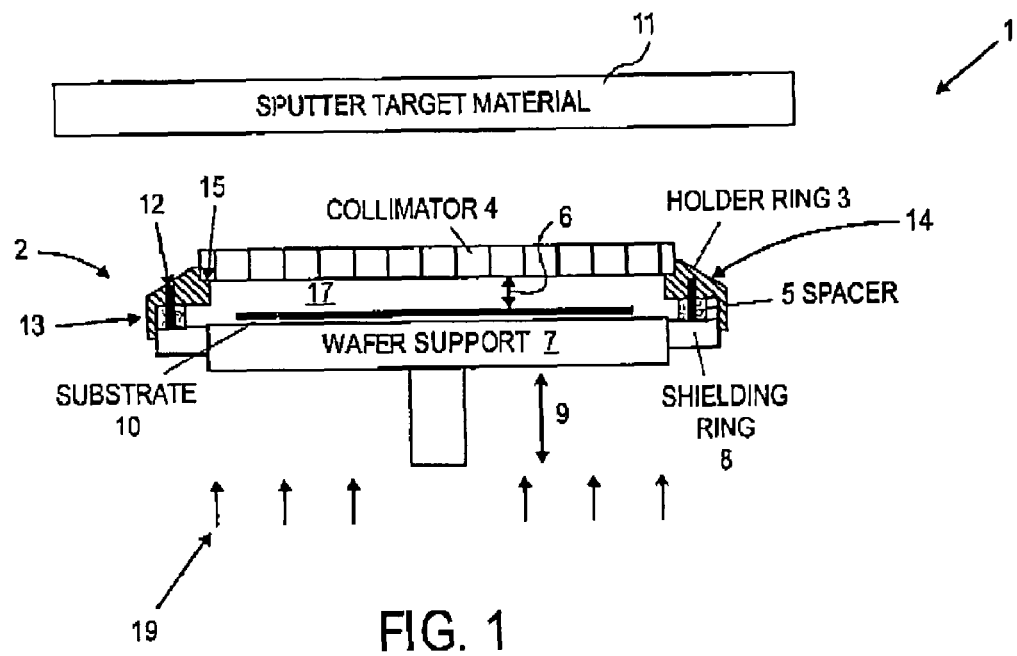
FIG. 1 illustrates a cross sectional view of an embodiment of a collimator holder device within a PVD apparatus.

FIG. 1 illustrates a cross sectional view of an embodiment of a collimator holder device 2 located within a physical vapor deposition (PVD) apparatus 1. However, embodiments of the invention may also include any structure, such as collimators, masks, filters, gas distribution plates, targets, samples, anodes, monochrometers, and detectors, to be precisely positioned a height above, and possibly parallel, to substrates or other structures, such as masks, collimators, targets, anodes, monochrometers, samples, and detectors, which may be used in any chemical, optical, and/or ionic apparatus or process, such as, sputtering, physical vapor deposition (PVD), atomic layer deposition (ALD), evaporation, chemical vapor deposition (CVD), plasma etching, ion milling, x-ray and electron and ion beam lithography, electron and x-ray spectroscopy, and scanning and tunneling electron microscopy. Embodiments of the invention may include a collimator holder device 2, comprising; a holder ring 3 further comprising a shelf 15 capable of manually positioning a collimator 4 a precise spacer distance 6 above and approximately parallel to a wafer support 7. The spacer distance 6 is defined to be the distance between the bottom of the collimator 6 and the top of the substrate 10 being processed, when the collimator 6 is held in position by the collimator holder device 2. In an embodiment, one or more spacers 5 are attached to the holder ring 3, wherein the one or more spacers 5 rest on a shielding ring 8 external to and independent of the wafer support's movements 9. In some embodiments, the spacer distance 6 is adjustable to predetermined distances by modifying the spacers 5.

Figure 6:
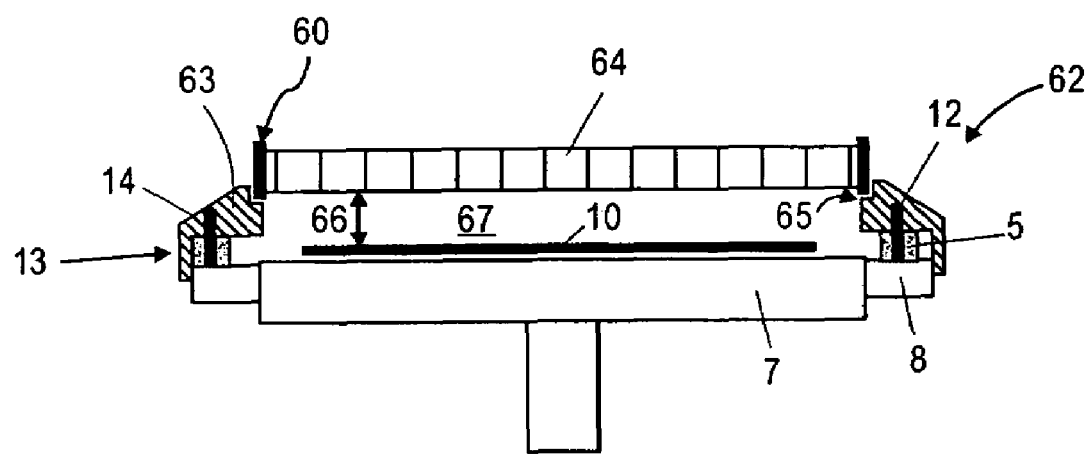
FIG. 6 illustrates a cross sectional view of an embodiment of a collimator holder device with a collimator having a metal band.

In an embodiment, the collimator 4 rests on the shelf 15, wherein the lower surface of the collimator 4 may be positioned approximately parallel to the wafer support 7. In an embodiment, the shelf 15 on the holder ring 3 may have a width wide enough to reduce the risk of the collimator 4 from becoming off-balance or falling off the shelf 15, but not so wide as to increase the deposition rate of material on the shelf 15 and thus increase the risk of a shelf surface that is uneven or not level. A shelf 15 that is not level or uneven may cause the collimator 4 not to be parallel to the wafer support 7. FIGS. 1 and 6 illustrate some embodiments, in which the outside diameter of the collimator 4 or the outside diameter of the metal band 60 attached to the collimator 4 may have an outer diameter slightly less than the outer diameter of the shelf 15, so that the collimator 4 and/or collimator band 60 may cover the shelf 15 and reduce the deposition rate of material on the shelf 15. In an embodiment, the shelf 15 on the holder ring 3 may have a width between about 0.1 inches and about 0.5 inches. In an embodiment, the shelf 15 on the holder ring 3 may have a width about 0.25 inches.

In an embodiment, the spacer distance 6 may be adjusted by stacking one or more spacers 5 onto the holder ring 3. In an embodiment, the stacked spacers 5 may interlock with each other. Embodiments of a spacer 5 comprising spacer discs 41 and spacer rings 50 are illustrated in FIGS. 4A-4C and FIGS. 5A-5B, respectively. In an embodiment, the thicknesses of the stackable spacers 41, 50 may range from about 0.05 inches to about 2.0 inches. In some embodiments, the stackable spacers 41, 50 may have thicknesses of 0.2, 0.4, and 0.6 inches. In various embodiments, spacers 5 may comprise one or more stackable spacers 41, 50 comprising any flat planar structure, or disc 41, or ring 50, or any combination thereof.

Figure 4A:
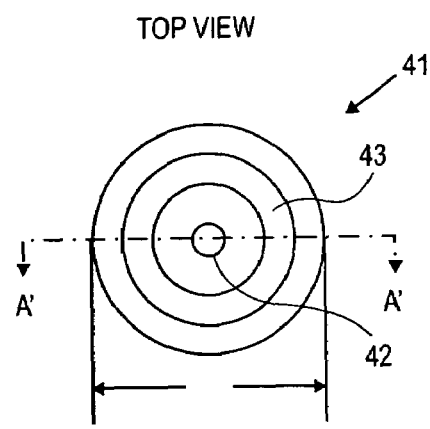
FIGS. 4A to 4C illustrate a top view and cross sectional views of an embodiment of an interlocking spacer disc and a stack of spacer discs.
Figure 4B:
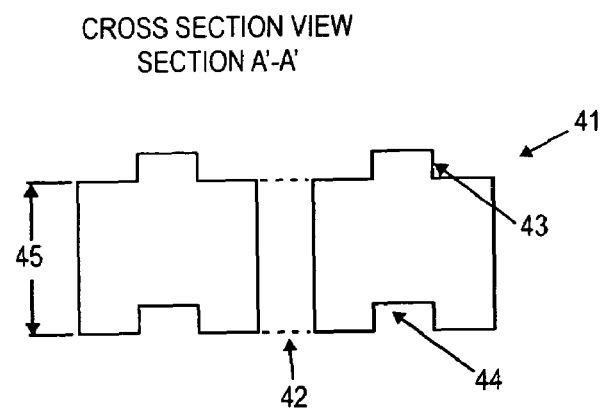
Figure 4C:
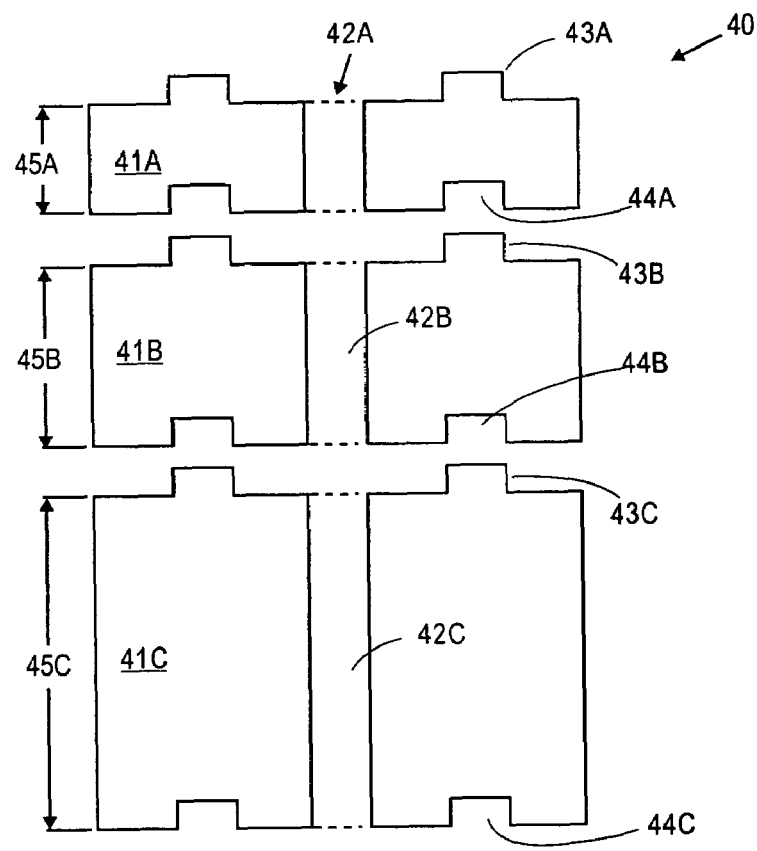

Referring to FIGS. 4A-4C, in some embodiments, the spacer discs 41 may interlock with each other, so that they may be stacked to create a spacer stack 40 of varying thicknesses, which may be used as a spacer 5 of a desired thickness. In an embodiment, the spacer discs 41 interlock with each other by the disc protrusion 43 fitting into the disc recess 44 of another spacer disc 41. In an embodiment illustrated in FIG. 4C, the top spacer disc 41A may have the protrusion 43A fit into a matching recess (not shown) in the holder ring 3. The stacking of spacer discs 41 adjusts the height of the spacers 5, and therefore, permits the adjustment of the spacer distance 6. In an embodiment, the spacer distance 6 of the collimator above the wafer support 7 may be large enough to reduce the risk of a honeycomb pattern onto the substrate 10 to be processed, but not so large as to substantially lose the directionality of the ions impinging upon the substrate 10. A honeycomb pattern may result when the honeycomb walls of the collimator 4 interfere with the gases immediately below the honeycomb walls, which may interfere with the processing of the region of substrate 10 directly under the honeycomb walls, thus leaving a honeycomb pattern on the substrate 10 being processed. In an embodiment, the spacer distance 6 of the collimator 4 above the wafer support 7 may be between about 0.5 inches to about 2.0 inches. In one embodiment, the spacer distance 6 of the collimator 4 above the wafer support 7 may be a spacer distance 6 between about 0.75 inches to about 1.0 inches.

Figures 2A, 2B:
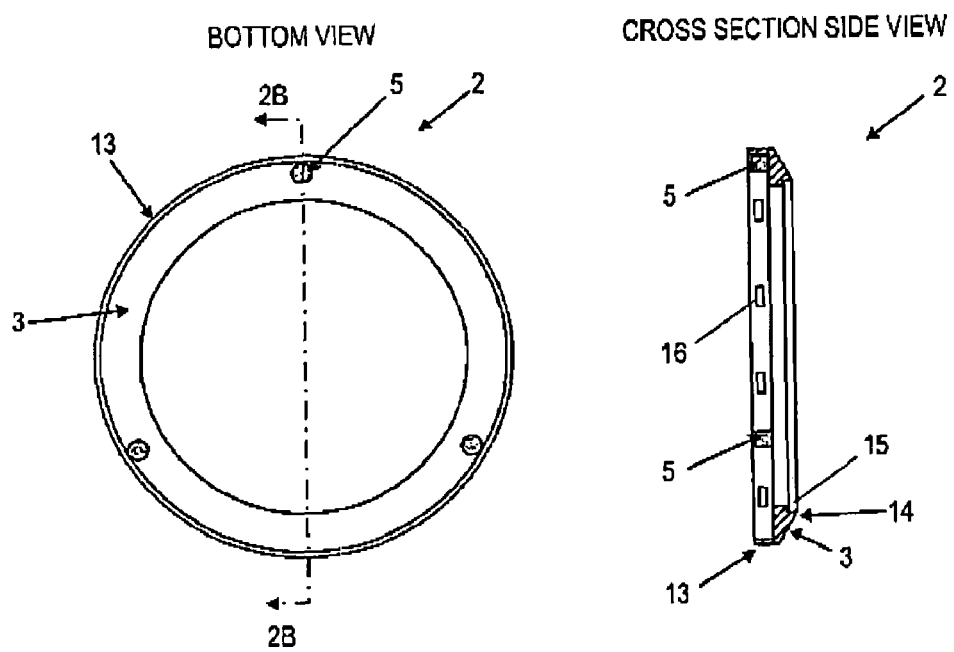
FIGS. 2A to 2B illustrate a bottom view and a cross sectional view of an embodiment of a collimator holder device.

In an embodiment, spacers 5, which may be attached to different locations on the holder ring 3, may function as legs or feet for the holder ring 3. Referring to FIGS. 2A and 4C, in an embodiment, three or more spacer legs 5 may be attached to the underside of the holder ring 3 in three or more locations, wherein each spacer leg 5 may comprise one or more spacer discs 41. In an embodiment, three spacers 5, acting as three legs or feet, may be used to provide a wobble-free and stable structure for the collimator holder device 2. In some embodiments, one or more screws 12 may be used to attach the spacers 5 to the holder ring 3. In an embodiment illustrated in FIG. 4B, a screw 12 passes through the spacer disc 41, via a spacer screw hole 42, and into a screw hole (shown in FIG. 1 with screw 12 inserted) formed into the underside of the holding ring 3. In an embodiment, one screw may be used to attach each spacer 5, functioning as a leg or foot to the holder ring 3. In an embodiment, the screw hole, shown with screw 12 in FIG. 1, may be formed into the underside of the holder ring 3, but may not pass completely through to the top of the holder ring 3, and thus reduces the risk of deposits forming inside the screw holes and onto the screws 12. In an embodiment, the screws 12 to attach the spacer 5 to holder ring 3 may comprise titanium (Ti).

Figure 5A:
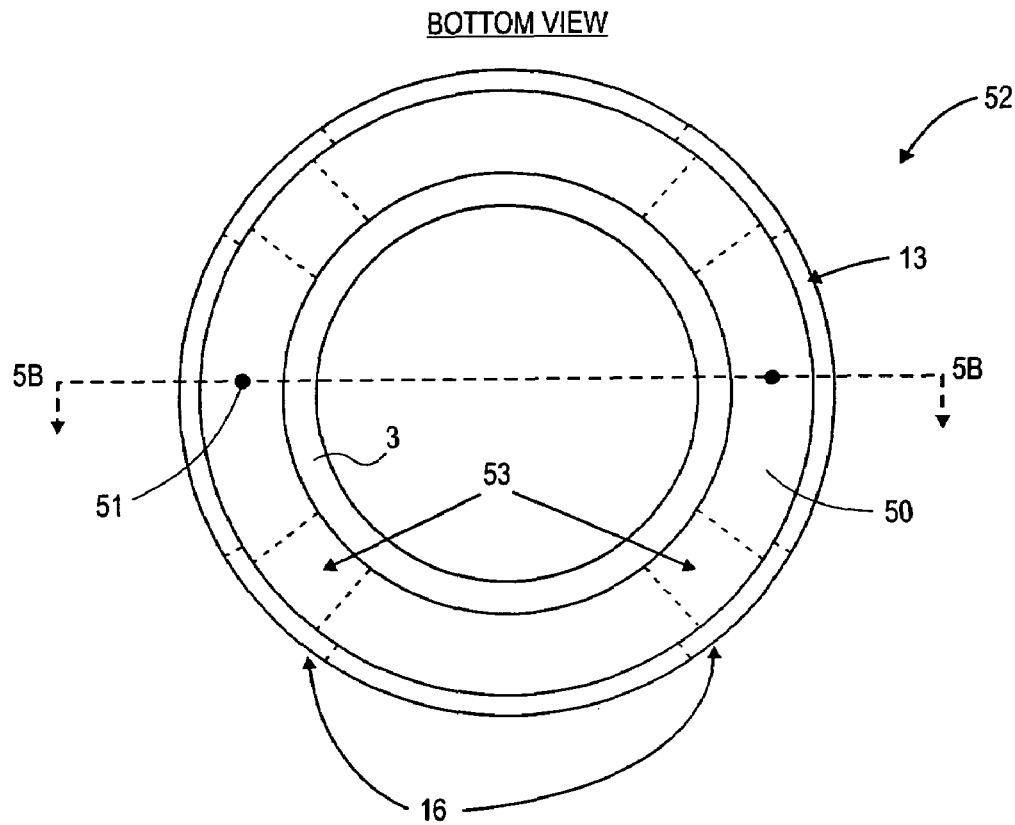
FIGS. 5A to 5B illustrate a bottom view and a cross sectional view of an embodiment of a holding ring with stacked interlocking ring spacers.
Figure 5B:
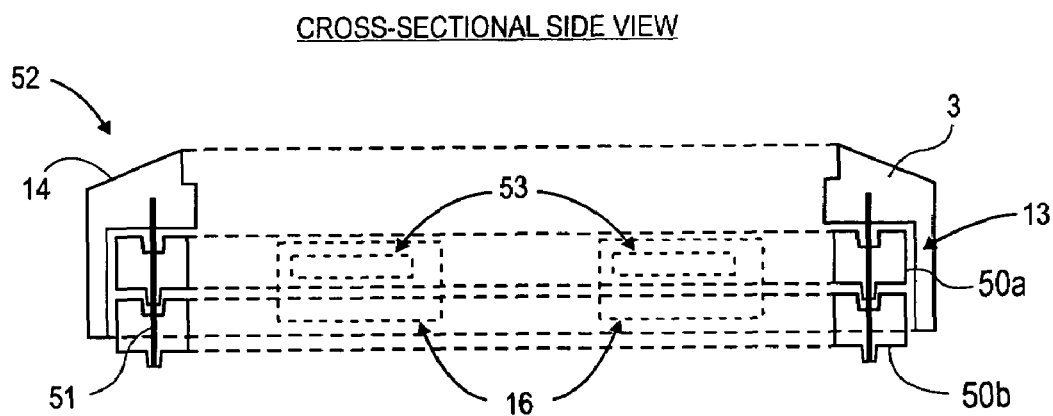

FIGS. 5A-5B illustrate embodiments, which may have one or more spacer rings 50, which may be interlocking and stacked into a stacked ring spacer 50a, 50b, which may be used to adjust the spacer distance 6. In an embodiment illustrated in FIG. 5B, the protrusion in spacer ring 50a fits into the recess in spacer ring 50b, and the protrusion in spacer 50b may fit into a recess (not shown) formed in the shielding ring 8, illustrated in FIG. 1. In another embodiment, the protrusions of the spacer rings 50a, 50b may be on top of the spacer rings 50a, 50b, and the protrusion on top of spacer ring 50a may fit into a recess (not shown) in the holder ring 3. In an embodiment, the spacer ring 50 may be attached to the underside of the holder ring 3 in one or more locations, and in an embodiment, with one or more ring screws 51. One embodiment comprises two ring screws 51, which may be titanium (Ti), which attach one or more spacer rings 50 to the holder ring 3.

In some embodiments illustrated in FIG. 1, the spacer 5 may comprise one or more materials selected from the group consisting of: titanium, copper, stainless steel, and any combination thereof. In an embodiment, the spacer 5 material should have a melting temperature higher than that of aluminum. Aluminum spacers 5 may melt during operation of the plasma based apparatus 1 due to the generation of a large amount of heat during operation of the apparatus. In one embodiment, the spacers 5 may comprise any flat planar structure, in any geometric shape, such as a rectangle or triangle. Further, some embodiments, may include combinations of stackable spacers 41, 50, such as a ring spacer 50, illustrated in FIG. 5B, stacked upon a flat planar rectangle spacer or spacer disc 41, illustrated in FIG. 4B. Such combinations of stackable spacers 41, 50, may provide ventilation to the mini-chamber 17, illustrated in FIG. 1, by providing gaps between the holder ring 3 and the shielding ring 8. In an embodiment illustrated in FIG. 1, the mini-chamber 17 may be defined as the region between the collimator 4 and the wafer support 7 and the region internal to the holder ring 3 and a holder ring wall 13.

In some embodiments illustrated in FIG. 1, the holder ring 3 may further comprise a holder ring wall 13, wherein the holder ring wall 13 comprises a ring concentric to and attached to the bottom of the holder ring 3, and wherein the holder ring wall 13 may be external to the spacers 5. In an embodiment illustrated in FIGS. 2B, 3A, 3B, the holder ring wall 13 may further comprise one or more slots 16, wherein the slots 16 provide ventilation for the mini-chamber 17. One or more ventilation holes or slots 16 in the holder ring wall 13 may permit the passage of gas and plasma to flow between the areas inside and outside the holder ring wall 13. Ventilation holes or slots 16 may facilitate the exchange of reactive and exhaust gases near the surface of the substrate 10 being processed. Ventilation holes or slots 16 may also improve process uniformity by helping to equalize the pressure differences proximate to the region above the substrate 10, and thus may improve gas uniformity and flow. Improved gas uniformity and flow may result in improved process uniformity on the substrate 10 being processed. In an embodiment, the gas may comprise argon.

In an embodiment illustrated in FIGS. 5A, 5B, the spacer ring 50 comprises one or more ring vents 53, which may comprise holes in the spacer ring 50 that permit the passage of gas to flow between the areas inside and outside the spacer ring 50. In an embodiment containing a holder ring wall 13, it may be desirable in some embodiments, to provide slots 16 in the holder ring wall 13, which are aligned with the ring vents 53, as illustrated in FIG. 5B, to permits the venting of gases. Ring vents 53 and ventilation slots 16 may facilitate the exchange of reactive and exhaust gases near the surface of the substrate 10, and may help equalize pressure differences, and thus, may improve process uniformity.

In embodiments illustrated in FIGS. 1, 2B, 5B, 6-8, the holder ring 3, 63, 73, 83 further comprises a lip 14, having a chamfer edge on the top surface of the outer edge of the holder ring 3, 63, 73, 83. The slanted slope of the chamfer lip 14 may reduce the rate of deposition of material on the holder ring 3, 63, 73, 83, and thus may reduce the frequency of cleaning the holder ring 3, 63, 73, 83.

In embodiments illustrated in FIGS. 1, 6-8, the shelf 15 of the holder ring 3, 63, 73, 83 may be located on the top surface of the holder ring 3, 63, 73, 83. In embodiments illustrated in FIGS. 1, 6, and 8, the shelf 15 of the holder ring 3, 63, 83 may be on the top surface of the inner edge of the holder ring 3, 63, 83. Such configurations may help facilitate the alignment of the collimator 4, 64, 84 by forcing the collimator 4, 64, 84 to fit within the holder ring 3, 63, 83. In another embodiment illustrated in FIG. 7, the shelf 15 of the holder ring 73 may be on the top surface of the holder ring 73 and outside an inner edge lip 78. Such a configuration may help facilitate the alignment of the collimator 4 by forcing the collimator to fit onto the holder ring 73 over the inner edge lip 78.

In an embodiment illustrated in FIG. 1, the wafer support 7 may be capable of moving up and down. In an embodiment, the wafer support 7 may comprise stainless steel, or aluminum, or any combination thereof. In an embodiment, the wafer support 7 may be coated. In an embodiment, the shielding ring 8 may comprise aluminum and may be a stationary part of the equipment.

Figure 7:
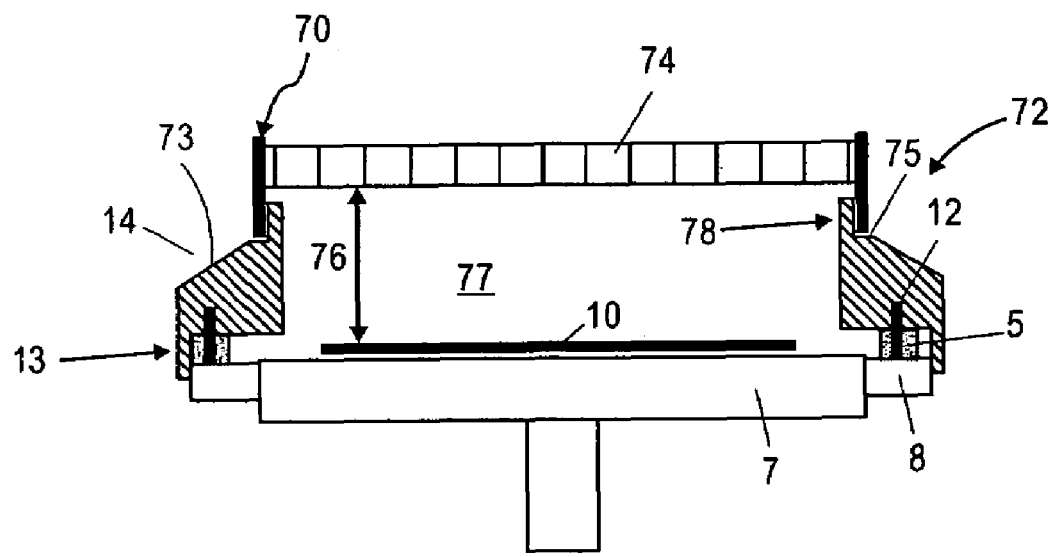
FIG. 7 illustrates a cross sectional view of an embodiment of a collimator holder device with a collimator band external to an inner lip of the holder ring.
Figure 8:
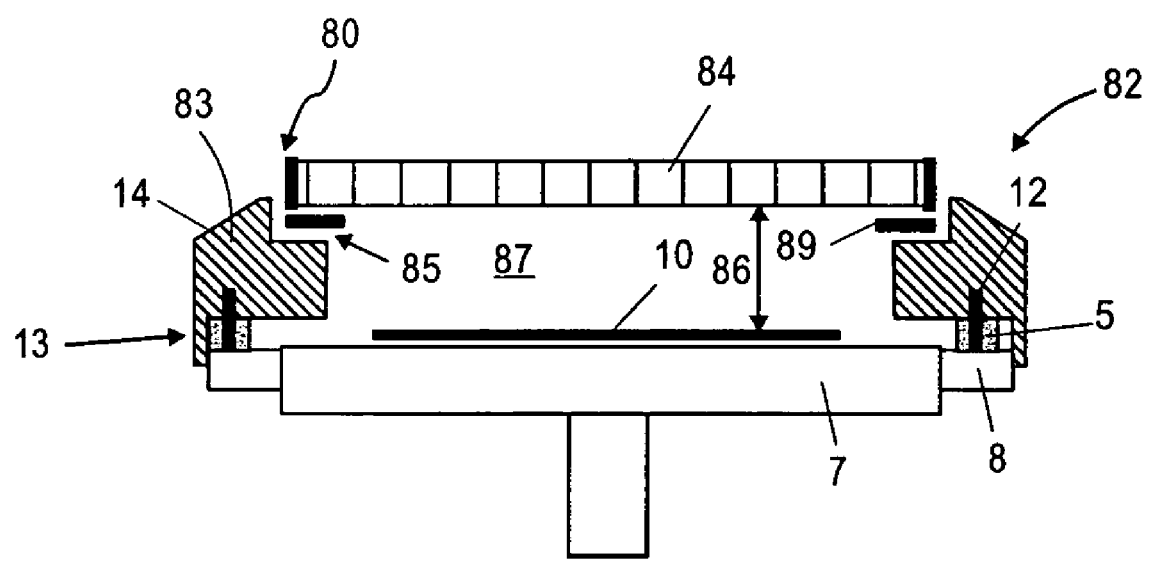
FIG. 8 illustrates a cross sectional view of an embodiment of a collimator holder device with a collimator having a metal washer.

Referring to FIGS. 6-8, in some embodiments the collimator may further comprise a collimator heat sink 60, 70, 80, 89 on the outer edge of the collimator. The collimator heat 60, 70, 80, 89 sink may comprise one or more metal bands or rings 60, 70, 80, or one or more metal washers 89, or any combination thereof. In embodiments illustrated in FIGS. 6-8, the collimator heat sink 60, 70, 89 may provide a point of contact, having a relatively large contact area, to the shelf 65, 75, 85 of the holder ring 63, 73, 83. Therefore, large amounts of heat may be removed from the collimator 64, 74, 84 into the holder ring 63, 73, 83 through the collimator heat sink 60, 70, 89. This may reduce the risk of excessive heat build up in the collimator 64, 74, 84 which may cause damage to the collimator 64, 74, 84, such as warping and breaks in the honeycomb structure. In some embodiments, the collimator heat sink 60, 70, 80, 89 comprises titanium.

In many embodiments illustrated in FIGS. 1, 6-8, the holder ring 3, 63, 73, 83 comprises a means of holding the collimator 4, 64, 74, 84, a precise spacer distance 6, 66, 76, 86 above and approximately parallel to the wafer support 7. In some other embodiments (not shown), the means to hold the collimator 4 in position a precise spacer distance 6 above and approximately parallel to the wafer support 7, may include but are not limited to one or more shelves, or protrusions, or recesses, or cantilevers, or fingers, or fins, or grates, or hooks, or notches, or any combination thereof, in or on the holder ring 3, or in or on objects attached to the holder ring 3. In some embodiments illustrated in FIGS. 6-8, the collimator 4 may be modified by the means of attaching one or more collimator heat sinks 60, 70, 80, 89 to the collimator 64, 74, 84.

FIG. 6 illustrates an embodiment of a collimator holding device 62 comprising a holder ring 63, one or more spacers 5, wherein the spacers 5 may be attached to the holder ring 63, wherein the holder ring 63 comprises a shelf 65 on the inner edge of the holder ring 63. In an embodiment, the collimator 64 may have a collimator heat sink 60 comprising a metal band or ring attached to the collimator 64. In an embodiment, the collimator heat sink 60 may be thick enough to provide sufficient heat capacity to reduce the risk of damage from thermal spikes in a production environment and may have enough contact with the holder ring 63 to obtain sufficient heat transfer to reduce the risk of damage due to excessive heat build up. In an embodiment, the collimator 64 may be manually placed on the shelf 65, or manually removed, without the need for tools, which results in positioning a collimator 64 a precise spacer distance 66 above and approximately parallel to the wafer support 7 in a very quick and inexpensive process.

FIG. 7 illustrates an embodiment of a collimator holding device 72 comprising a holder ring 73, one or more spacers 5 attached to the holder ring 73, and an inner lip 78 protruding up on the inside edge of the holder ring 73. In an embodiment, the collimator 74 may have a collimator heat sink 70 comprising a metal band or ring attached to the collimator 74. The collimator heat sink 70 should extend below the collimator 74 sufficient for the bottom of the collimator 74 to clear the top of the protruding inner lip 78 of the holder ring 73, while the bottom of the collimator heat sink 70 rests on the shelf 75 on the top of the holder ring 73, thereby enabling the collimator 74 to be easily positioned by self-aligning to the holder ring 73, and results in being approximately parallel to the wafer support 7. The location of the shelf 75 external to the protruding inner lip 78 may help reduce the risk of deposits forming on the shelf 75, since the shelf 75 is located external to the mini-chamber 77, where the substrate 10 is being processed.

FIG. 8 illustrates an embodiment of a collimator holding device 82 comprising a holder ring 83, one or more spacers 5 attached to the holder ring 83, wherein the collimator 84 may have a collimator heat sink 80, 89 comprising a metal washer 89 attached to the bottom of the collimator 84. In an embodiment, the metal washer 89 has an outer diameter less than the outer diameter of the shelf 85 of the holder ring 83, and an inner diameter larger than the substrate 10 being processed. Thereby the metal washer 89 attached to the bottom edge of the collimator 84 provides a large contact area between the shelf 85 of the holder ring 83 and the collimator 84, resulting in large heat transfer rates away from the collimator 84. An embodiment comprises multiple collimator heat sinks 80, 89, comprising a metal band 80 in combination with the metal washer 89, which may be attached to the collimator 84 and/or each other. Such a combination may result in an even greater heat capacity and even larger heat transfer contact area, thus greatly reducing the risks of excess heating and damage to the collimator 84.

Other embodiments comprising a metal washer include variations on the embodiments of FIG. 7. For example, attaching the metal washer to the collimator 74 and resting the metal washer 89 on the protruding inner lip 78 of the holder ring 73, instead of the collimator heat sink 70 resting on the shelf 75 of the holder ring 73. Another embodiment may comprise both the metal washer 89 resting on the protruding inner lip 78 and the collimator heat sink 70 also resting on the shelf 75 of the holder ring 73. The combined contacts of both the metal washer 89 and the collimator heat sink 70 may result in greater heat transfer rates to the holder ring 73.

Figure 3A:
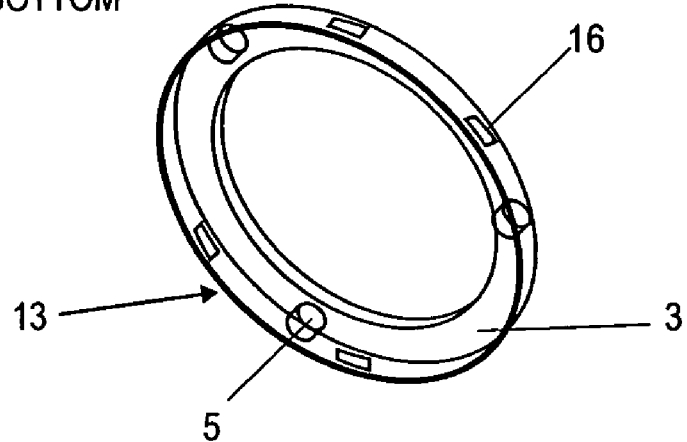
FIGS. 3A to 3B illustrate a 3D bottom view and a 3D top view of an embodiment of a collimator holder device.
Figure 3B:
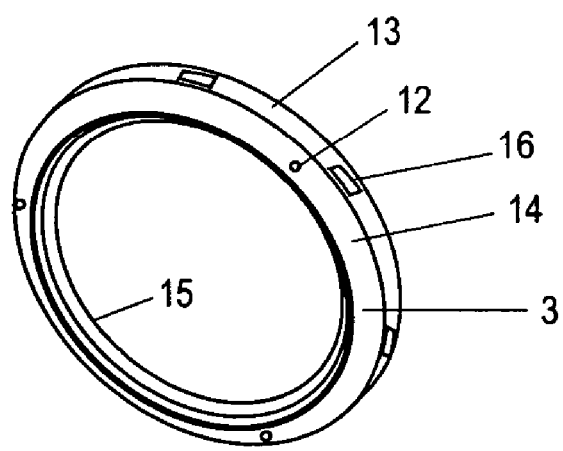

In some embodiments illustrated in FIGS. 1, 6-8, the holder ring 3, 63, 73, 83 may further comprise a thermally and electrically conductive material, wherein the holder ring 3, 63, 73, 83 may act as a heat sink to draw heat, as well as charge, away from the collimator 4, 64, 74, 84, and may transfer the heat and electric charge to the shielding ring 8. A build up of excess heat may damage the collimator 4, 64, 74, 84, and a build up of charge may result in reduced plasma directionality and may change the process dynamics within the min-chamber 17, 67, 77, 87. In an embodiment, the holder ring 3, 63, 73, 83 in combination with the collimator 4, 64, 74, 84 may form a mini-chamber 17, 67, 77, 87 over the substrate 10 and wafer support 7, which may improve process controls of the plasma over the substrate 10. Changes in the spacer distance 6 may result in changes in the process dynamics of the mini-chamber 17, 67, 77, 87, which may be used to control the process dynamics of the mini-chamber 17, 67, 77, 87, such as the temperature, residence time, flow rates, flow patterns, and concentration of reactants, gases, and plasmas, in the region above the substrate 10 being processed. Some embodiments may further comprise one or more vent slots 16 in the holder ring wall 13 attached to the underside of the holder ring 3, as illustrated in FIGS. 2B, 3A, and 3B, which may be used to control the process dynamics of the mini-chamber 17, 67, 77, 87, illustrated in FIGS. 1, 6, 7, and 8. In an embodiment illustrated in FIGS. 5A and 5B, a collimator holder device 2 comprising ring spacers 50 may comprise one or more ring vents 53, which may be aligned with the one or more vent slots 16 in the holder ring wall 13, which may provide a means to control the process dynamics of the mini-chamber 17, 67, 77, 87, illustrated in FIGS. 1, 6, 7, and 8. The size of the mini-chamber 17, 67, 77, 87 and the use of vent slots 16 may be used to control the flow, concentration, partial pressures, and residence time of gases and plasmas in the region above the substrate 10. In some embodiments, the holder ring 3, 63, 73, 83 may comprise titanium, or stainless steel, or copper, or aluminum, or any combination thereof. In an embodiment, wherein the holder ring 3, 63, 73, 83 comprises titanium, the holder ring 3, 63, 73, 83 may be more resistant to cleans, resulting in longer life in processing substrates 10.

Referring to FIG. 6, in an embodiment, the holder ring 63 comprises a ceramic insulator to electrically isolate the collimator 64, wherein the collimator 64 may be capable of holding a voltage bias. In an embodiment, the collimator 64 may be biased with an AC and/or DC voltage, which may facilitate the etching or removal of material from the substrate 10 in a plasma etching apparatus.

Referring to FIG. 8, in an embodiment, the collimator holder device 82 further comprises one or more roughened surfaces on any or all of the exposed surfaces above or near the substrate 10 and/or wafer support 7. In some embodiments, any of the exposed surfaces of the collimator 84, holder ring 83, holder ring wall 13, metal band 80, metal washer 89, spacers 5, wafer support 7 and shielding ring 8 may be all or partially roughened. In an embodiment, the roughened surface has a Ra factor of about 100 micro inches to about 300 micro inches. In one embodiment, the collimator holder device 82 comprises a roughened surface having a Ra factor of about 180 micro inches to about 200micro inches. In an embodiment, the exposed roughened surfaces of the collimator holder device 82 may have been roughened by a bead blasting process. The surfaces of the collimator holder device 82 may be roughened to reduce the risk of particles flaking off of the surface of the collimator holder device 82 and depositing onto the substrate 10 being processed.

FIG. 1 illustrates an embodiment, wherein the inner diameter of the section of collimator 4 being transparent to an ion flux, may be larger than the outer diameter of a substrate 10 placed on the wafer support 7, by about 0.2 inches to about 2.0 inches. In the embodiment illustrated in FIG. 1, the inner diameter of the section of collimator 4 being transparent to an ion flux may be the inner diameter of the holder ring 3, because the shelf 15 would block the ion flux and result in that section of the collimator 4 not being transparent. Similarly, in an embodiment illustrated in FIG. 8, the inner diameter of the section of collimator 84 transparent to an ion flux may be the inner diameter of the metal washer 89 because the metal washer 89 would block the ion flux. In embodiments illustrated in FIGS. 1, 6-8, the diameter of the section of collimator 4, 64, 74, 84 transparent to an ion flux may be larger than the diameter of a substrate 10 by about 0.5 inches to about 1.0 inches. The collimator 4, 64, 74, 84 having a larger diameter than that of the substrate 10, may result in better reliability and quality at the edges of the substrates 10 being processed.

FIG. 1 illustrates an embodiment of an apparatus, comprising a plasma or ionic gas, for processing a substrate 10, comprises a chamber (not shown) having shielding; a wafer support 7, capable of having a voltage bias, wherein the wafer support 7 permits a substrate 10 to be placed on the wafer support 7 for processing; a collimator 4; a collimator holder device 2 resting on a shielding ring 8, wherein the shielding ring is concentric to the wafer support 7; and a plasma generating apparatus to generate a plasma above the collimator 4. In an embodiment, the shielding ring 8 may be external to and near the wafer support 7. Embodiments of the invention comprise a plasma based substrate processing apparatus, wherein the plasma based apparatus further comprises a process selected from the group consisting of: sputtering, physical vapor deposition (PVD), atomic layer deposition (ALD), evaporation, and plasma etching apparatuses.

In an embodiment illustrated in FIG. 1, the apparatus, comprising a plasma or ionic gas, may be a physical vapor deposition apparatus 1, further comprising a target 11 positioned above both the collimator 4 and the substrate 10 to be processed. In some embodiments, a target 11 may be used for supplying deposition material. In an embodiment, the target 11 comprises titanium nitride (TiN). In an embodiment the plasma based apparatus 1 further comprising a gas source 19 supplied from below the wafer support 7. In an embodiment, the combination of the target 11 above the mini-chamber 17 and the gas source supplied from below the wafer support 7, may provide improved process control and uniformity. The source gas may diffuse up uniformly around the substrate 10, which is protected by the mini-chamber 17. The target 11 produces a plasma, which may then be driven into the mini-chamber 17 through the collimator 4. Process control and uniformity may be improved because the collimator holder device 2, which may comprise a mini-chamber 17, protects plasma chemistry and dynamics in the region above the substrate 10, such as from dilution by source gases that have not interacted with the target 11. In an embodiment, the source gas is selected from the group consisting of: a reactive gas, a non-reactive gas, and any combination thereof. In an embodiment, the means for generating a plasma comprises a source gas. In an embodiment, the source gas comprises argon.

In some embodiments illustrated in FIG. 1, the collimator holder device 2 further comprises a holder ring 3 comprising a shelf 15 to manually rest and position the collimator 4 a spacer distance 6 above and approximately parallel to the wafer support 7; a spacer 5 attached to said holder ring 3, and the spacer 5 rests on the shielding ring 7, which is independent of the wafer support's movements 9. The spacer distance 6 may be adjustable to predetermined distances by modifying the spacers 5. In an embodiment, the spacer distance 6 may further comprise the combined thicknesses of one or more additional spacers stacked and attached to the underside of the holder ring 3.

In some embodiments, the spacer distance 6 of the collimator 4 above the wafer support 7 may be large enough to reduce the risk of a forming a pattern onto the substrate 10 to be processed that resembles the pattern of the collimator 4, but not so large as to substantially lose the directionality of the ions impinging upon the substrate 10 being processed. In an embodiment, the spacer distance 6 of the collimator 4 above the wafer support 7 may between about 0.5 inches to about 2.0 inches.

In some embodiments, the collimator 4 comprises a thermally and electrically conductive material selected from the group consisting of: titanium, stainless steel, copper, aluminum, and any combination thereof. In an embodiment, the collimator 4 comprises titanium, which may result in greater resistance to cleanings and result in longer life. In some embodiments, the collimator 4 may have an aspect ratio corresponding to that of the openings or trenches on the substrate 10 being processed. In an embodiment, the collimator 4 has approximately the same aspect ratio as the openings or trenches on the substrate 10 being processed. In an embodiment, the aspect ratios of both the collimator 4 and the openings or trenches on the substrate 10 are high aspect ratios.

In some embodiments illustrated in FIG. 1, the collimator 4 may be capable of being installed and/or removed from the holder ring 3 and/or the chamber, without the need to use tools. In an embodiment, the collimator holder device 2 may be capable of installation and/or removal from the chamber, without the need to use tools. In an embodiment, the installation and/or removal of the collimator 4 from either the process chamber or the holder ring 3 may be done manually and quickly, without the need for tools or retooling. In an embodiment illustrated in FIG. 1, the collimator 4 is capable of being installed and/or removed manually from the shelf 15 on the top inner side of the holder ring 3. In an embodiment, the collimator 4 may be attached to the holder ring 3, which rests on the shielding ring 8, and the collimator 4 and holder ring 3, together, may be manually removed and/or installed, without the need for tools.

In some embodiments, the plasma based substrate processing apparatus may comprise a plasma etching and/or removing apparatus or a deposition apparatus, wherein the holder ring 3 may comprise an insulator, resulting in the holder ring 3 electrically isolating the collimator 4, wherein a voltage bias may be applied to the collimator 4. In an embodiment, the insulator comprises a ceramic. In an embodiment, the collimator 4 may be biased with an AC and/or DC voltage, which may result in further ionizing the gas near the collimator 4 and/or attracting or repelling ions to or from the collimator region. In an embodiment, the collimator voltage may be approximately the same voltage as the shielding in the chamber.

In some embodiments illustrated in FIG. 1, the plasma based substrate processing apparatus may comprise a holder ring 3 further comprising a thermally and electrically conductive material, wherein the holder ring 3 may act as a heat sink to draw heat, as well as charge, away from the collimator 4, and then may transfer the heat to the shielding ring 8. The voltage of the collimator 4 may be approximately the same voltage as the shielding in the chamber. In some embodiments, the holder ring 3 may comprise titanium, or stainless steel, or copper, or aluminum, or any combination thereof. In an embodiment, the holder ring 3 may comprise titanium.

In some embodiments illustrated in FIG. 1, a method of using a collimator holder device 2, comprises manually placing a holder ring 3 having one or more spacers 5 attached to the underside of the holder ring 3, into a chamber of a plasma based apparatus 1 comprising an energetic ion flux generator, a wafer support 7, and a shielding ring 8. In an embodiment, the collimator 4 may already be on the holder ring 3 when the holder ring 3 is placed into the chamber. In an embodiment, the collimator 4 may be attached to the holder ring. In an embodiment, the one or more spacers 5 resting on a shielding ring 8, may be external to and independent of the movements of a wafer support 7. In an embodiment, the holder ring 3 further comprises a shelf 15 on the top surface of the holder ring 3.

An embodiment of a method of using a collimator holder device 2, illustrated in FIG. 1, may further comprise manually resting a collimator 4 on the shelf 15 of the holder ring 3, wherein, the collimator 4 may be positioned a spacer distance 6 above and approximately parallel to the wafer support 7, when the holder ring is placed on the shielding ring 8. In an embodiment, the spacer distance 6 may be adjustable to predetermined distances by modifying the spacers 5. In an embodiment, the spacers 5 may be modified by adding, removing, replacing, or any combination thereof, of some or all of the spacers 5 attached to the holder ring 3, by means of a spacer screw in the spacer screw hole 42. An embodiment of a method of using a collimator holder device 2 may further comprise placing a substrate 10 on the wafer support 7; applying a voltage bias to the wafer support 7; and forming an energetic ion flux over the collimator 4. An embodiment may further comprise applying a voltage bias to the collimator 4.

An embodiment of a method of using a collimator holder device 2 may further comprising the manual installation and/or removal of the collimator 4 from the chamber, without the need for tools. In some embodiments, the collimator 4 and/or holder ring 3 with spacers 5, may be further serviced by a process selected from the group consisting of: cleaning, repairing, replacing with another collimator and/or holder ring with spacers, or any combination thereof. The ability of the collimator 4 and the holder ring 3 to be removed manually and quickly may be very effective in reducing downtime of the apparatus 1 for servicing operations. Furthermore, the quick removal and installation of different holder rings and collimators may be very effective in providing process flexibility and customization without substantial increases in downtime of the apparatus for modifications of the collimator 4 and mini-chamber 17 specifications. In an embodiment, servicing the collimator 4 and/or holder ring 3 comprises removing from and/or installing into the chamber, without the use of tools, providing access to the substrate 10 and wafer support 7. In some embodiments, the collimator and/or holder ring may be cleaned and/or repaired. In an embodiment, the collimator 4 and/or holder ring 3 may be removed, serviced, and reinstalled with precisely the same spacer distance as before its removal, and the collimator 4 may still remain approximately parallel to the wafer support 7. The collimator holder device 2 enables the collimator to be repeatedly positioned precisely the same fixed distance above and approximately parallel to a substrate 10 for processing.

In an embodiment, it may be desirable to replace one collimator 4 and/or holder ring 3 having spacers 5 with another collimator 4 and/or holder ring 3 having spacers 5, which may have different specifications consistent with another process for another substrate 10. In an embodiment, it may be desirable to modify the spacers 5 attached to the holder ring 3 to change the spacer distance 6, which may be sufficient for different process specifications for different processing of a substrate 10. In some embodiments, any combination of cleaning, repairing, and replacing may be performed in the servicing operation.

In an embodiment of a method of using a collimator holder device 2 in a plasma deposition process, the process may comprise filling the bottom of high aspect ratio openings or trenches on the substrate 10, the collimator 4 has an aspect ratio corresponding to that of the openings or trenches on the substrate 10. In an embodiment, the degree of directionality of the plasma exiting the collimator 4, may be correlated to the aspect ratio of the collimator 4, and may be approximately the same degree of directionality of the plasma required to fill the bottom of the openings or trenches having a comparable aspect ratio. In some embodiments, the aspect ratio of the collimator may be higher than that of the openings or trenches, resulting in filling the bottom of the openings or trenches faster.

In an embodiment, the method of using a collimator holder device 2, illustrated in FIG. 1, may further comprise an etching and/or removing apparatus comprising a plasma etching and/or removing process of material from the substrate. In an embodiment, the process of etching and/or removing of material at the bottom of high aspect ratio openings or trenches on the substrate 10, may further comprise the collimator 4 having an aspect ratio corresponding to that of the openings or trenches on the substrate 10. In an embodiment, the aspect ratio of the collimator 4 may be greater than the aspect ratio of the openings or trenches on the substrate 10, which may result in forming thin sidewall spacers on the sidewalls of the openings or trenches on the substrate 10. In an embodiment, a plasma etching process comprises a reactive ion etching process. In an embodiment, a removing process comprises an ion milling process.

In some embodiments, various means are disclosed to provide the desired collimator 4, both in aspect ratio and materials, at the desired distance from the substrate 10. This results in greater process consistency from substrate to substrate and greater process uniformity across each substrate 10. Some embodiments disclose means for easily removing and installing both the collimator 4 and the holder ring 3, without the need for tools and without the need to modify existing equipment, thereby resulting in less downtime and less expense to service and clean the collimator 4. Further embodiments disclose means for fast and easy removal and replacement of collimators 4 and holder rings 3 that enables customizing and changing of collimators 4 for different applications, which may result in improved process flexibility, reliability, and performance.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A collimator holder device, comprising:
   a holder ring comprising a shelf, wherein the shelf receives the manual placement of a collimator onto the shelf, wherein the manual placement of the collimator, without the use of tools, is the only step necessary to position the collimator a spacer distance above and approximately parallel to a wafer support for preparing the collimator to process a substrate;
   one or more spacers attached to said holder ring, wherein said one or more spacers rest on a shielding ring; and
   wherein, the spacer distance is adjustable to predetermined distances by modifying the size of the one or more spacers used and/or stacking together one or more additional spacers on the one or more spacers.

2. The collimator holder device of claim 1, wherein the spacer is selected from the group consisting of: a flat planar structure, disc, ring, or any combination thereof, and the spacer distance may be adjusted by stacking one or more spacers onto the holder ring.

3. The collimator holder device of claim 2, wherein the stacked spacers may interlock to each other.

4. The collimator holder device of claim 2, wherein the thicknesses of the spacers range from about 0.05 inches to about 2.0 inches.

5. The collimator holder device of claim 1, further comprising, three or more spacer legs, each leg comprising one or more spacers stacked together, wherein the spacer legs are attached to the underside of the holder ring in three or more locations.

6. The collimator holder device of claim 1, wherein the spacer is selected from the group consisting of: titanium, copper, stainless steel, and any combination thereof.

7. The collimator holder device of claim 1, wherein said holder ring further comprises a holder ring wall, wherein the holder ring wall comprises a ring concentric to and attached to the bottom of the holder ring, and wherein the holder ring wall may be external to the spacers.

8. The collimator holder device of claim 7, wherein the holder ring wall further comprises a slot, wherein the slot provides limited ventilation for a mini-chamber, defined by the region between the collimator and the wafer support and internal to the holder ring and holder ring wall.

9. The collimator holder device of claim 1, wherein the holder ring further comprises a lip, having a chamfer edge on the top surface of the outer edge of the ring.

10. The collimator holder device of claim 1, wherein the shelf of the holder ring may be located on the top surface of the holder ring.

11. The collimator holder device of claim 10, wherein the collimator further comprises a collimator heat sink on the outer edge of the collimator, selected from the group consisting of: a metal band, a metal ring, a metal washer, and any combination thereof, wherein the collimator heat sink provides a point of contact to the shelf of the holder ring.

12. The collimator holder device of claim 11, wherein the collimator heat sink comprises titanium.

13. The collimator holder device of claim 1, wherein the holder ring further comprises a thermally and electrically conductive material, wherein the holder ring may act as a heat sink to draw heat, as well as charge, away from the collimator.

14. The collimator holder device of claim 13, wherein the thermally and electrically conductive material may be selected from the group consisting of: titanium, stainless steel, copper, aluminum, and any combination thereof.

15. The collimator holder device of claim 1, wherein the collimator holder device further comprises a roughened surface having an Ra factor of about 100 micro inches to about 300 micro inches.

16. The collimator holder device of claim 1, wherein the holder ring comprises a ceramic insulator to electrically isolate the collimator, wherein the collimator may be capable of holding a voltage bias.

17. A plasma based apparatus for processing a substrate, comprising:
a chamber;
a wafer support, wherein the wafer support permits a substrate to be placed on the wafer support for processing;
a collimator;
a collimator holder device resting on a shielding ring, wherein the shielding ring is concentric to the wafer support;
wherein the collimator holder device further comprises:
a holder ring comprising a shelf, wherein the shelf receives the manual placement of a collimator onto the shelf to position the collimator a spacer distance above and approximately parallel to the wafer support;
one or more spacers attached to said holder ring, wherein the one or more spacers rest on the shielding ring;
wherein, the spacer distance is adjustable to predetermined distances by modifying the size of the one or more spacers used and/or stacking together, one or more additional spacers on the one or more spacers;
a mini-chamber bounded by the collimator, the wafer support, and the collimator holder device, wherein the mini-chamber protects the region above the substrate from contamination by a source gas by confining the mini-chamber only to the approximate region between the collimator and the wafer support; and
a plasma generating apparatus to generate a plasma above the mini-chamber.

18. The plasma based apparatus of claim 17, wherein the spacer distance of the collimator above the wafer support may be large enough to reduce the risk of a forming a pattern onto the substrate to be processed that resembles the pattern of the collimator, but not so large as to substantially lose the directionality of the ions impinging upon the substrate to be processed.

19. The plasma based apparatus of claim 17, wherein changes in the spacer distance of the collimator above the wafer support changes the process dynamics of the mini-chamber.

20. The plasma based apparatus of claim 19, wherein the spacer distance of the collimator above the wafer support is between about 0.5 inches to about 2.0 inches.

21. The plasma based apparatus of claim 17, wherein the plasma based apparatus may be selected from a group consisting of: sputtering, physical vapor deposition (PVD), atomic layer deposition (ALD), evaporation, and plasma etching apparatuses.

22. The plasma based apparatus of claim 17, wherein the plasma based apparatus, further comprising:
a target positioned above the mini-chamber; and
a gas source supplied from below the wafer support.

23. The plasma based apparatus of claim 17, further comprises a vent slot in a holder ring wall attached to the underside of the holder ring so as to control the process dynamics of the mini-chamber.

24. A method of using a collimator holder device, comprising:
manually placing, in only a single necessary step, without the use of tools, a holder ring having one or more spacers attached to the underside of said holder ring, into a chamber of an apparatus and onto a shielding ring, wherein the holder ring provides a shelf, wherein the shelf receives a collimator, such that the collimator is precisely positioned above a wafer support, which is used to hold and position a substrate for processing; and
manually placing, in only a single necessary step, without the use of tools, a collimator onto the shelf of the holder ring provided for positioning the collimator, wherein the collimator is positioned a spacer distance above and approximately parallel to the wafer support for preparing the collimator to process a substrate.

25. The method of using a collimator holder device of claim 24, further comprising adjusting the spacer distance to predetermined distances by adding, removing, replacing, or any combination thereof, of all or some of the spacers attached to the holder ring.

26. The method of using a collimator holder device of claim 24, wherein, the holder ring further comprises a shelf on the top surface of the holder ring; and
manually placing the collimator on the shelf of the holder ring, wherein, the collimator is positioned a spacer distance above and approximately parallel to the wafer support when the holder ring is placed on the shielding ring.

27. The method of using a collimator holder device of claim 26, further comprising the manual installation and/or removal of the collimator from the chamber, without the need for tools.

28. The method of using a collimator holder device of claim 27, wherein the collimator and/or holder ring with spacers, may be further serviced by a process selected from the group consisting of: cleaning, repairing, replacing with another collimator and/or holder ring with spacers, or any combination thereof.

* * * * *